US008722471B2

(12) United States Patent
Batude et al.

(10) Patent No.: US 8,722,471 B2

(45) Date of Patent: May 13, 2014

(54) METHOD FOR FORMING A VIA CONTACTING SEVERAL LEVELS OF SEMICONDUCTOR LAYERS

(71) Applicants: STMicroelectronics S.A., Montrouge (FR); Commissariat à l'Énergie Atomique et aux, Paris (FR)

(72) Inventors: Perrine Batude, Grenoble (FR); Yves Morand, Grenoble (FR)

(73) Assignees: STMicroelectronics S.A., Montrouge (FR); Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 13/748,126

(22) Filed: Jan. 23, 2013

(65) Prior Publication Data

US 2013/0196500 A1 Aug. 1, 2013

(30) Foreign Application Priority Data

Jan. 31, 2012 (FR) ..................................... 12 50884

(51) Int. Cl.
*H01L 21/00* (2006.01)

(52) U.S. Cl.
USPC .................... 438/152; 438/638; 257/E21.476

(58) Field of Classification Search
USPC .......... 438/152, 153, 637, 638, 639, 640, 700
See application file for complete search history.

(56) References Cited

U.S. PATENT DOCUMENTS

| | | | | |
|---|---|---|---|---|
| 7,816,257 | B2 * | 10/2010 | Cheong et al. | 438/639 |
| 7,833,847 | B2 * | 11/2010 | Kim et al. | 438/153 |
| 2008/0087932 | A1 | 4/2008 | Son et al. | |

FOREIGN PATENT DOCUMENTS

KR 20080049161 A 6/2008

OTHER PUBLICATIONS

Search Report and Written Opinion dated Oct. 25, 2012 from corresponding French application No. 12/50884 filed Jan. 31, 2012.

* cited by examiner

*Primary Examiner* — Reema Patel

(74) *Attorney, Agent, or Firm* — Wolf, Greenfield & Sacks, P.C.

(57) ABSTRACT

A method for forming a via connecting a first upper level layer to a second lower level layer, both layers being surrounded with an insulating material, the method including the steps of: a) forming an opening to reach an edge of the first layer, the opening laterally continuing beyond said edge; b) forming a layer of a protection material on said edge only; c) deepening said opening by selectively etching the insulating material to reach the second lower level layer; and d) filling the opening with at least one conductive contact material.

8 Claims, 4 Drawing Sheets

59 58 T2 23 35 27 27 31 25 53 29 31 21 29 15 T1 3 7 7 5 9 9 1

METHOD FOR FORMING A VIA CONTACTING SEVERAL LEVELS OF SEMICONDUCTOR LAYERS

CROSS REFERENCE TO RELATED APPLICATIONS

This application claims the priority benefit of French patent application number 1112970.7, filed on Jul. 28, 2011, which is hereby incorporated by reference to the maximum extent allowable by law.

BACKGROUND

1. Technical Field

The present disclosure relates to integrated circuits comprising components distributed over several levels. Such integrated circuits comprise a stack of at least two semiconductor layers separated by an insulating layer. It is spoken of three-dimensional (3D) integration, and of 3D integrated circuits.

2. Discussion of the Related Art

Increasing the component density in integrated circuits generally is a constant concern. A solution is to manufacture integrated circuits comprising components distributed over several levels of semiconductor layers.

FIG. 1 is a cross-section view schematically showing an example of 3D integrated circuit comprising transistors distributed over two levels of semiconductor layers.

A silicon layer 1 of the lower level comprises MOS transistors T1, laterally insulated from one another, a single transistor being shown. Each transistor T1 comprises a gate 3 insulated from layer 1 by a gate insulator 5, and spacers 7 surrounding the gate. Source and drain regions 9 extend in layer 1 on either side of gate 3. A metal silicide layer 11 covers the upper surface of source and drain regions 9. Silicide layer 11 may also cover the lateral surfaces of the source and drain regions.

An insulating layer 15 separates silicon layer 1 from the lower level of another silicon layer 21 of the upper level. Like silicon layer 1, silicon layer 21 comprises MOS transistors T2, laterally insulated from one another, a single transistor being shown. Each transistor T2 comprises a gate 23 insulated from layer 21 by a gate insulator 25, spacers 27, and source and drain regions 29. A metal silicide layer 31 covers the upper surface of source and drain regions 29, and also possibly the lateral surfaces of these source and drain regions. An insulating layer 35 covers layer 21 and transistors T2.

In certain applications, the source or drain region of a transistor located on the upper level semiconductor layer is desired to be connected to the source or drain region of a transistor located on the lower level semiconductor layer. To achieve this, a via contacting the upper level semiconductor layer to the lower level semiconductor layer is desired to be formed.

FIGS. 2A and 2B are cross-section views schematically illustrating successive steps of a method for forming a via contacting two levels of semiconductor layers.

FIG. 2A illustrates a 3D structure of the type illustrated in FIG. 1 after the forming of an opening 41 providing access to upper level layer 21 and to lower level layer 1. Before the forming of opening 41, a previous masking step has been carried out to protect the regions which are not desired to be etched. Opening 41 has been formed by an anisotropic etching method, for example, by plasma etching. At the end of the etching, the bottom of opening 41 reaches a portion of silicide layer 11 covering lower level layer 1. The etching method is selected to selectively etch insulating layers 35, 15, but not silicon layer 21 covered with silicide 31. However, if upper level silicon layer 21 is very thin, for example, of a thickness much smaller than the thickness of insulating layer 15, layers 21, 31 risk, as illustrated, being partially or totally removed on forming of opening 41.

FIG. 2B illustrates the 3D structure after the filling of opening 41 with a conductive material 48. A via 49 contacting upper level layer 21 and lower level layer 1 is obtained. If upper level layer 21 has been totally removed at the previous step, the contact on layer 21 is taken only by lateral surface 46, 47 of layers 21, 31. The contact surface area is much smaller than if the contact was taken on the upper surface of layer 21 covered with silicide 31, and this all the more as layers 21, 31 are very thin. As a result, the electric contact between via 49 and the source or drain region of upper level layer 21 is not well established.

A solution to avoid the removal of upper level layers 21, 31 on forming of opening 41 comprises increasing the thickness of source and drain regions 29, after the forming of spacers 27 and before the forming of silicide layer 31, by local epitaxy. This however causes an increase in the stray capacitance between the gate and the source and drain regions of the upper level transistors, which is not desirable.

SUMMARY

Thus, an embodiment provides a method for forming a via contacting several levels of semiconductor layers, which overcomes at least some of the disadvantages of the above-described methods.

An embodiment provides a method for forming a via contacting two levels of semiconductor layers, enabling to protect the upper level semiconductor layer during the forming of the opening providing access to the two levels.

Thus, an embodiment provides a method for forming a via connecting a first upper level layer to a second lower level layer, both layers being surrounded with an insulating material, the method comprising the steps of: a) forming an opening until an edge of the first layer is reached, the opening laterally continuing beyond said edge; b) fixating a layer of a protection material on said edge only; c) deepening said opening by selectively etching the insulating material to reach the second lower level layer; and d) filling the opening with at least one conductive contact material.

According to an embodiment, the protection material is a conductive material.

According to an embodiment, at step b), the layer of the conductive protection material is formed by electroless deposition.

According to an embodiment, the first and second layers are silicon layers covered with a metal silicide.

According to an embodiment, the metal silicide is based on a metal selected from the group comprising platinum and nickel.

According to an embodiment, the thickness of the insulating material separating the first layer from the gates of transistors formed on the second layer ranges between 10 and 500 nm; the thickness of the first layer ranges between 5 and 150 nm; and at step b), a layer of the protection material having a thickness ranging between 10 and 50 nm is formed.

According to an embodiment, the conductive protection material is selected from the group comprising platinum and nickel.

According to an embodiment, the conductive contact material is tungsten.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

FIGS. 3A to 3D are cross-section views schematically illustrating successive steps of a method for forming a via contacting two levels of semiconductor layers.

Figure 1:
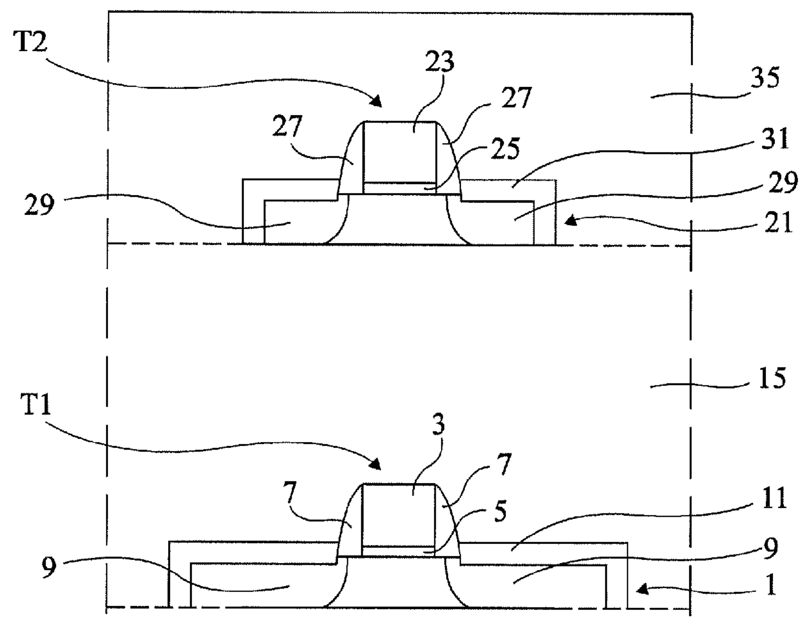
FIG. 1, previously described, is a cross-section view schematically showing an example of a 3D integrated circuit comprising two levels of semiconductor layers.
Figure 2A:
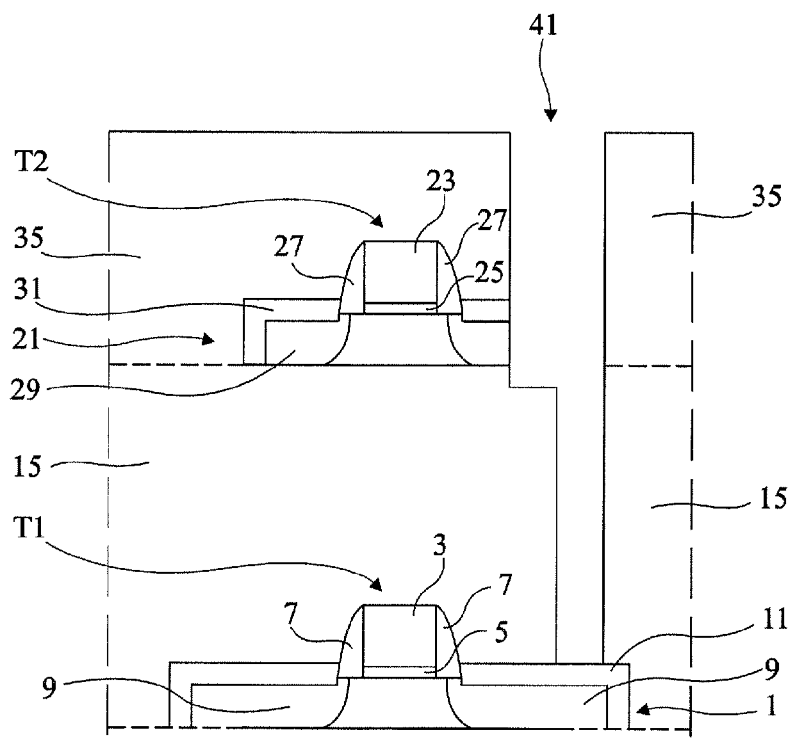
FIGS. 2A and 2B, previously described, are cross-section views schematically illustrating successive steps of a method for forming a via contacting two levels of semiconductor layers.
Figure 2B:
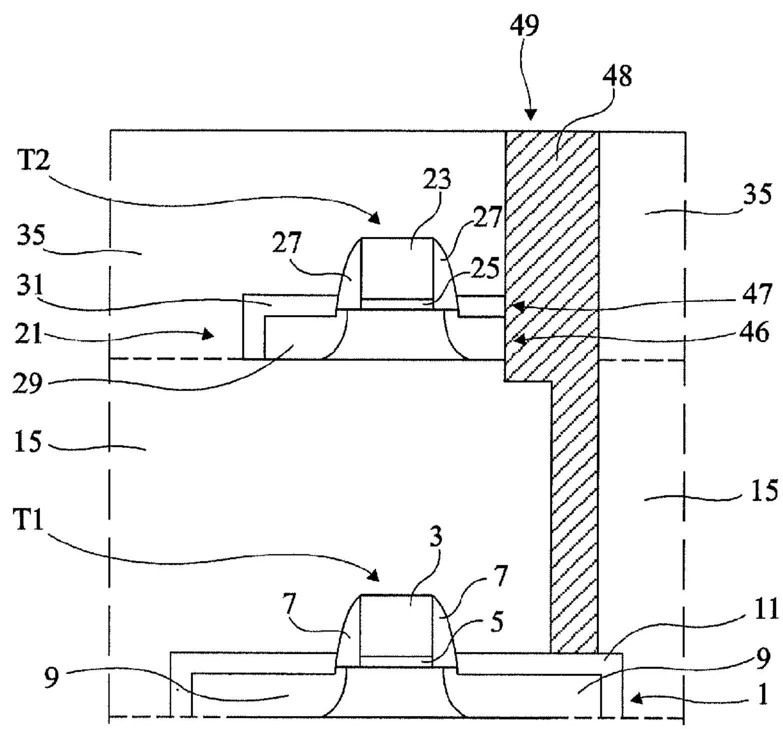
Figure 3A:
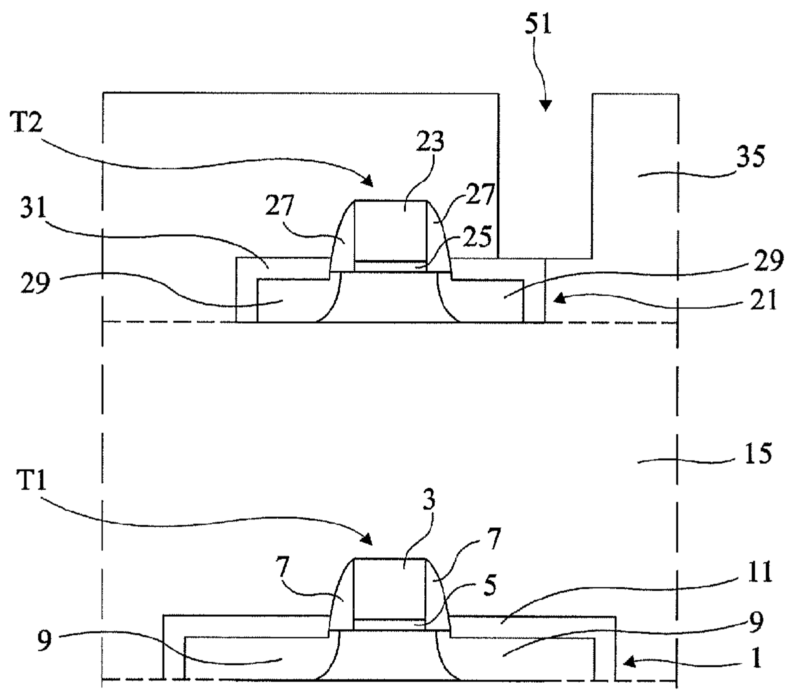
FIGS. 3A to 3D are cross-section views schematically illustrating successive steps of a method for forming a via contacting two levels of semiconductor layers.

FIG. 3A shows a 3D structure of the type illustrated in FIG. 1 after the forming of an opening 51 to reach an edge of metal silicide layer 31 covering upper level silicon layer 21, opening 51 laterally continuing beyond the edge of layer 31. Before the forming of opening 51, a previous masking step has been carried out to protect the regions which are not desired to be etched. Opening 51 has been formed by an anisotropic etching method, for example, by plasma etching.

As an example of order of magnitude, the thickness of silicon layer 21 ranges between 5 and 150 nm, for example, on the order of 6 nm. Metal silicide layer 31 is for example based on platinum and/or nickel, and its thickness for example ranges between 5 and 30 nm, for example from 2 to 3 nm. Insulating layers 15 and 35 are for example made of silicon oxide. The thickness of insulating layer 15 located between gates 3 and layer 21 for example ranges between 10 and 500 nm, and for example is on the order of 100 nm.

As an example of order of magnitude, the width (or diameter) of opening 51 ranges between 20 and 300 nm, and for example is on the order of 100 nm, and the width of the portion of opening 51 laterally continuing beyond the edge of layer 31 for example ranges between 10 and 150 nm, and for example is on the order of 50 nm.

Figure 3B:
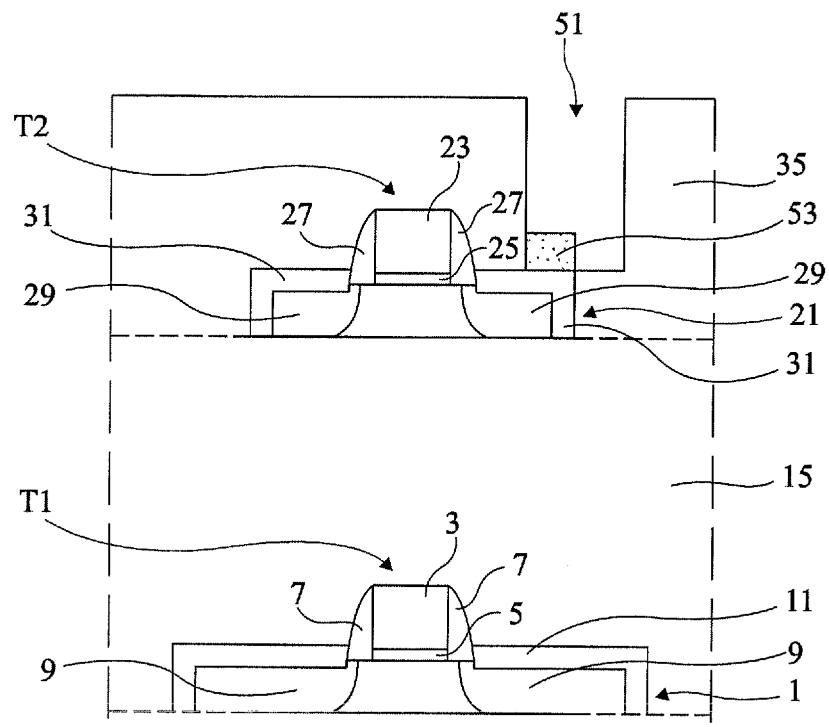

FIG. 3B illustrates the 3D structure after a step of forming of a layer of a conductive protection material 53 at the bottom of opening 51 formed at the previous step, only on the edge of silicide layer 31. Layer 53 may be formed by a so-called "electroless" autocatalytic deposition technique. The conductive material of layer 53 for example is a metal, for example, platinum or nickel. The thickness of the layer of conductive protection material 53 for example ranges between 10 and 50 nm, and for example is on the order of 20 nm. At the step illustrated in FIG. 3A, the etching may have slightly exposed the lateral surface of silicide layer 31 by overetching insulating layer 35. In this case, a layer of conductive protection material 53 also forms on the exposed portion of this lateral surface.

Figure 3C:
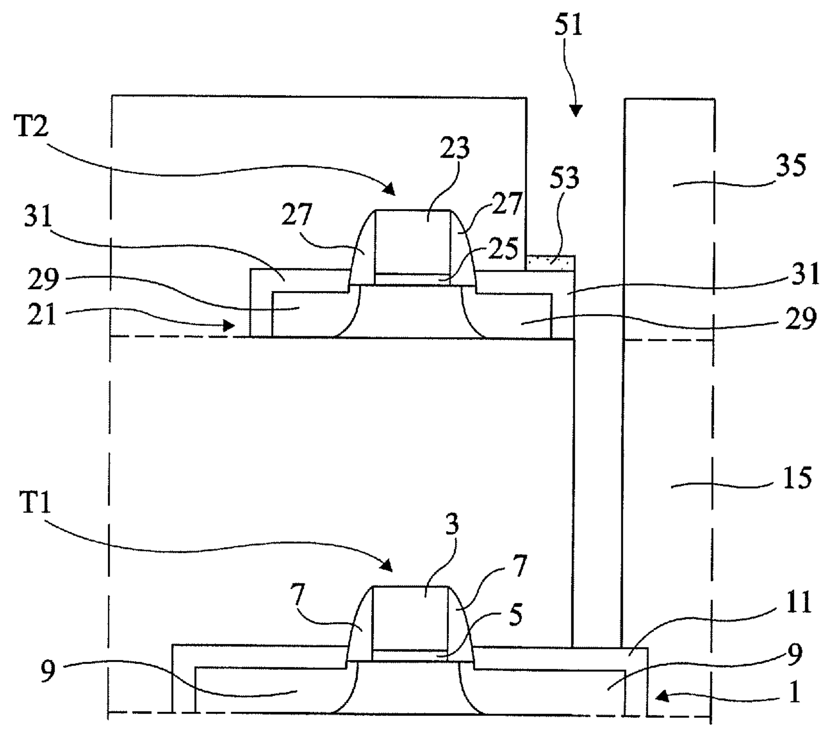

FIG. 3C illustrates the 3D structure after deepening of opening 51 to reach metal silicide layer 11 covering lower level silicon layer 1. The etching method is selected to selectively etch insulating layers 35 and 15 over conductive protection material 53, silicide 31, and silicon. The thickness of conductive protection layer 53 formed at the previous step has been selected according to the thickness of insulating layer 15, to protect upper level layers 21, 31 during the deepening of opening 51. Further, the width of the portion of opening 51 laterally continuing beyond the edge of layer 31 has been selected so that, in the case where conductive protection material layer 53 has also formed on the lateral surface of layer 31, it does not prevent the deepening of opening 51. Layer 53 may be partly removed on deepening of opening 51, but layer 31 remains protected.

Figure 3D:
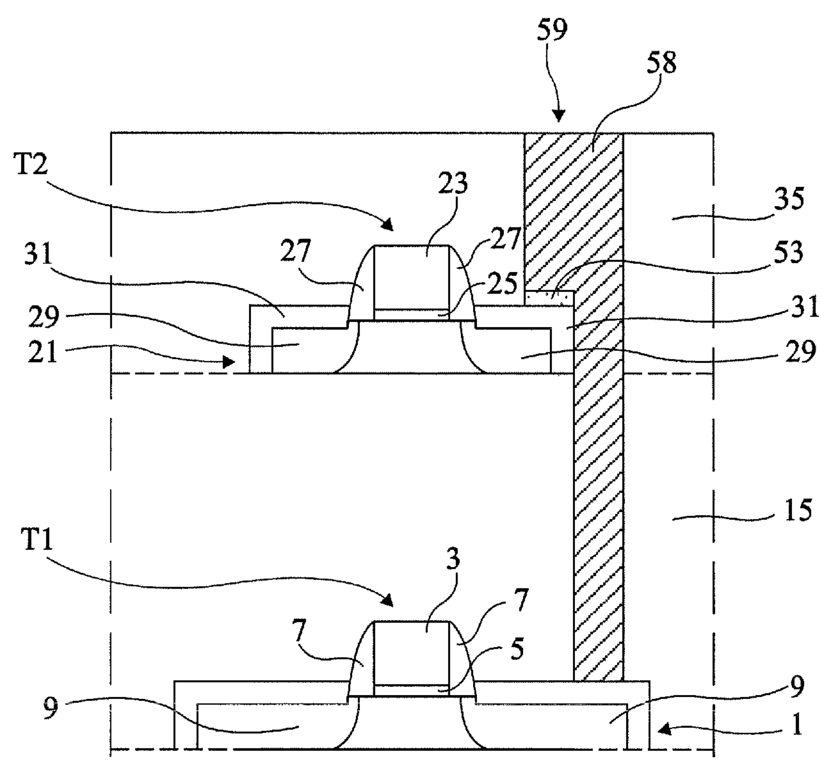

FIG. 3D illustrates the 3D structure after the filling of opening 51 with a conductive contact material 58, for example, tungsten. A via 59 contacting upper level layer 21 and lower level layer 1 is thus obtained. Opening 51 may also be filled with several layers of conductive materials, or with one or several layers of conductive material lining the opening walls and with an insulating material.

An advantage of a method of the type described in relation with FIGS. 3A to 3D is that the conductive protection material is only formed on the edge of the upper level layer, at a distance from the gate. Such a method thus causes no increase of the stray capacitance between the gate and the source and drain regions of the upper level transistors.

Specific embodiments have been described. Various alterations, modifications, and improvements will occur to those skilled in the art. In particular, although a method during which a via contacting a source or drain region of an upper level semiconductor layer and a source or drain region of a lower level semiconductor layer are formed has been described, the method of course applies to the forming of a via contacting any regions of two levels of semiconductor layers. Further, the concept may apply to a 3D structure comprising more than two levels of semiconductor layers. Further, although the protection material has been described as being a conductive material, which corresponds to one embodiment, the use of an insulating protection material, for example, an oxide, may be considered.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a via connecting a first upper level layer to a second lower level layer, both layers being surrounded with an insulating material, the method comprising the steps of:

a) forming an opening to reach an edge of the first layer, the opening laterally continuing beyond said edge;

b) forming a layer of a protection material on said edge only;

c) deepening said opening by selectively etching the insulating material to reach the second lower level layer; and d) filling the opening with at least one conductive contact material.

2. The method of claim 1, wherein the protection material is a conductive material.

3. The method of claim 2, wherein, at step b), the layer of the conductive protection material is formed by electroless deposition.

4. The method of claim 1, wherein the first and second layers are silicon layers covered with a metal silicide.

5. The method of claim 4, wherein the metal silicide is based on a metal selected from the group comprising platinum and nickel.

6. The method of claim 1, wherein:

the thickness of the insulating material separating the first layer from the gates of transistors formed on the second layer ranges between 10 and 500 nm;

the thickness of the first layer ranges between 5 and 150 nm; and at step b), a layer of the protection material having a thickness ranging between 10 and 50 nm is formed.

7. The method of claim 2, wherein the conductive protection material is selected from the group comprising platinum and nickel.

8. The method of claim 1, wherein the conductive contact material is tungsten.

* * * * *

UNITED STATES PATENT AND TRADEMARK OFFICE

CERTIFICATE OF CORRECTION

PATENT NO. : 8,722,471 B2
APPLICATION NO. : 13/748126
DATED : May 13, 2014
INVENTOR(S) : Perrine Batude et al.

It is certified that error appears in the above-identified patent and that said Letters Patent is hereby corrected as shown below:

In the Specification

At column 2, line 42 the word “fixating” should read --forming--.

Signed and Sealed this
Thirtieth Day of September, 2014

Michelle K. Lee

Michelle K. Lee
*Deputy Director of the United States Patent and Trademark Office*